US006486425B2

(12) United States Patent
Seki

(10) Patent No.: US 6,486,425 B2
(45) Date of Patent: Nov. 26, 2002

(54) ELECTROSTATIC MICRORELAY

(75) Inventor: Tomonori Seki, Kyoto (JP)

(73) Assignee: Omron Corporation, Kyoto (JP)

( * ) Notice: Subject to any disclaimer, the term of this patent is extended or adjusted under 35 U.S.C. 154(b) by 0 days.

(21) Appl. No.: 09/822,818

(22) Filed: Mar. 30, 2001

(65) Prior Publication Data

US 2002/0005341 A1 Jan. 17, 2002

(30) Foreign Application Priority Data

Nov. 26, 1998 (JP) .......................................... 10-335725

(51) Int. Cl.[7] ........................ H01H 57/00; H01H 51/22; H01L 29/96

(52) U.S. Cl. ........................ 200/181; 335/78; 335/207; 361/207; 257/415

(58) Field of Search ........................... 200/181; 335/78, 335/79; 361/207, 210; 257/415–421

(56) References Cited

U.S. PATENT DOCUMENTS

| | | | | |
|---|---|---|---|---|
| 5,278,368 A | * | 1/1994 | Kasano et al. | 200/181 |
| 6,054,659 A | * | 4/2000 | Lee et al. | 200/181 |
| 6,094,116 A | * | 7/2000 | Tai et al. | 200/181 X |
| 2002/0005341 A1 | * | 1/2002 | Seki | 200/181 |

FOREIGN PATENT DOCUMENTS

| | | | |
|---|---|---|---|
| JP | 5-2976 | * | 1/1993 |
| JP | 2000-113792 | * | 4/2000 |
| JP | 2000-164104 | * | 6/2000 |

OTHER PUBLICATIONS

Patent Abstracts of Japan, Publication No. 2000113792 A, Publication date Apr. 21, 2000, 1 page.
Patent Abstracts of Japan, Publication No. 2000164104 A, Publication date Jun. 16, 2000, 1 page.
Komura. Y.; Sakata. M.; Seki, T.; Kobayashi, K.; Sano, K.; Horiike, S.; Ozawa, K.; "Micro Machined Relay for High Frequency Application" Proceedings 47th Relay Conference, Apr. 19–21, 1999, Newport Beach, California, 8 pages.*

Patent Abstracts of Japan, Publication No. 05002976 A, Publication date Jan. 8, 1993, 1 page.*

* cited by examiner

*Primary Examiner*—J. R. Scott
(74) *Attorney, Agent, or Firm*—Rosenthal & Osha L.L.P.

(57) ABSTRACT

An electrostatic microrelay is disclosed. The electrostatic microrelay includes a fixed substrate having a fixed electrode and a fixed terminal on its upper surface and a moveable substrate having a moveable electrode and a moveable terminal on its lower surface. The moveable substrate is elastically supported by a support member that is disposed between the fixed substrate and the moveable substrate in a manner that the lower surface of the moveable substrate faces the upper surface of the fixed substrate at a certain distance. A protrusion is provided on the upper surface of the fixed substrate or the lower surface of the moveable substrate. The protrusion has a certain height. Upon applying voltage between the moveable electrode and the fixed electrode, the moveable electrode is attracted to the fixed electrode such that the protrusion provided on the upper surface of the fixed substrate or the lower surface of the moveable substrate contacts the other substrate and the moveable terminal elastically contacts the fixed terminal to close the microrelay in this order. Also, upon releasing the voltage from the electrode, the moveable terminal becomes reliably separated from the fixed terminal by a repulsive elastic force caused by the contact between the protrusion and the other substrate.

14 Claims, 9 Drawing Sheets

ELECTROSTATIC MICRORELAY

BACKGROUND OF THE INVENTION

An electrostatic microrelay known in the art is shown in FIG. 11A and FIG. 11B (Japanese Patent Laid-Open Publication HEI5-2976 and U.S. Pat. No. 5,278,368).

In this electrostatic microrelay, a moveable substrate 202 is elastically supported by a frame-like support portion 201 provided on the surface of a fixed substrate 200 so that a fixed electrode 203 formed on the upper surface of the fixed substrate 200 and a moveable electrode 204 formed on the lower surface of the moveable substrate 202 are placed facing each other. By applying a voltage between the fixed electrode 203 and the movable electrode 204, electrostatic attraction force is generated to attract the moveable electrode 204 toward the fixed electrode 203. As a result, the moveable substrate 202 is bent such that a moveable terminal 205 contacts a fixed terminal 206 to close the relay.

However, when the relay is closed at the terminals, cohesion or adhesion may occur. Therefore, in order to reliably break the contact of the terminals, elastic recovery force of the moveable substrate needs to be set large enough to separate the moveable terminal from the fixed terminal. For this reason, it is necessary to increase electrostatic attraction force between the electrodes, by, for example, increasing the driving voltage (voltage applied between the electrodes), increasing the electrode area where the electrodes are facing to each other, decreasing the distance between the electrodes, or using an electret. As a result, the volume of the microrelay has been increased and electric voltage durability of the terminals has been deteriorated, and structure and machining process of the microrelay becomes more complicated, resulting in increase of production cost.

SUMMARY OF THE INVENTION

Therefore, it is an object of the present invention to provide a microrelay having a better capability of breaking the contact of the terminals using a simple and small structure, and which can be easily manufactured at low-cost.

In order to achieve the above object, the present invention provides an electrostatic microrelay which comprises a fixed substrate having a fixed electrode thereon, and a moveable substrate having a moveable electrode thereon. The moveable substrate is positioned a selected distance from the fixed substrate. The moveable substrate faces the fixed substrate and is supported by a support member, wherein application of voltage between the moveable substrate and the fixed substrate generates an electrostatic attraction force therebetween so as to move the moveable electrode toward the fixed substrate so that a moveable terminal formed on the moveable substrate contacts a fixed terminal formed on the fixed substrate to close the microrelay. The electrostatic microrelay comprises a protrusion provided on at least one of the fixed substrate and the moveable substrate wherein the protrusion provided on one of the substrates contacts the other substrate after the movement of the moveable substrate toward the fixed substrate but before the terminals are closed.

Under this configuration, when a voltage is applied between the electrodes to generate electrostatic attraction force therebetween, a portion of the moveable substrate extending from the support member thereof is elastically deformed and the protrusion provided on either one of the substrates contacts the other substrate. By this movement, the moveable electrode comes close to the fixed electrode, thereby increasing the electrostatic attraction force. As a result the moveable substrate is partially elastically deformed around the protrusion, and the moveable electrode adheres to the fixed electrode such that the moveable terminals are closed at the fixed terminals. Thereafter, if the voltage applied between the electrodes is removed, the electrostatic attraction force disappears. In addition, the elastic force generated by the bend of the extending portion and the elastic force caused by the partial deformation of the protrusion at the time of contact with the substrate works as the separation force of the terminals. Once the protrusion is separated from the substrate, the moveable substrate recovers to its original opposing position portion due to the elastic force generated by the bend of the whole body.

The protrusion may be formed at least at one position between the support member and the moveable terminal.

The height of the protrusion may be the height or less at which the terminals can be closed by elastically deforming the moveable substrate at nearby the protrusion by using the electrostatic attraction force generated between the electrodes. For example, the height of the protrusion may be determined to be one third of the distance between the separated substrates. Under this configuration, the closing of the terminals is not obstructed by the existence of the protrusion.

By evenly supporting the moveable substrate via a plurality of beam members which extend from the moveable substrate, the moveable electrode may be smoothly moved both before and after the protrusion contacts the substrate.

Beam members elastically support the moveable substrate at two positions in point symmetry around the moveable terminal.

Signal lines are positioned on a single straight line on the fixed substrate.

The portion of the moveable substrate which opposes the signal line is removed, the moveable terminals are elastically supported at two positions which perpendicularly cross the straight line of the signal line but does not face the signal lines.

A pair of protrusions may be point-symmetrically formed around the moveable terminal where the protrusion first contacts either one of the substrates after the close of the terminals.

In this configuration, the terminal breaking force can be changed in two stages corresponding to the change of electrostatic attraction force regardless of the configuration which is adapted to the open-close operation of high frequency signals. Namely, in the range where the electrostatic attraction force is weak, the protrusions do not contact the opposing substrate, and the moveable substrate is easily deformed in accordance with electrostatic attraction force. Also, in the range where electrostatic attraction force is strong, the elastic force of the moveable substrate becomes large due to the contact of the protrusions with the opposing substrate. Moreover, the protrusion is formed in the position where it first contacts the opposing substrate after the terminals are closed. Therefore, because the elastic force of the moveable substrate can be changed at the most suitable position in relation to the electrostatic attraction curve, it becomes possible to improve the terminal separation characteristics.

The protrusions may be formed on either one of the substrates in the portion of the substrate that contacts the opposing substrate after the protrusion contacts the opposing substrate in order of precedence in which since change of the electric force by the side of the moveable contact can be made to meet the electrostatic attraction curve, it is enable to obtain suitable force of contact-breaking.

The protrusion may be formed of insulation material. By removing electrode from the portion where the protrusions contact, adhesion of organic materials between the protrusion and the electrode can be prevented, thereby achieving desired stable performance characteristics for a long period of time.

In addition, the electrostatic microrelay having the above configuration is suitable for opening and closing terminals used in wireless transmission apparatus and/or high frequency signal devices, such as radio devices and measuring devices.

DETAILED DESCRIPTION OF THE PREFERRED EMBODIMENTS

Referring now to the accompanying drawings, embodiments of the present invention are explained as follows.

Figure 1A:
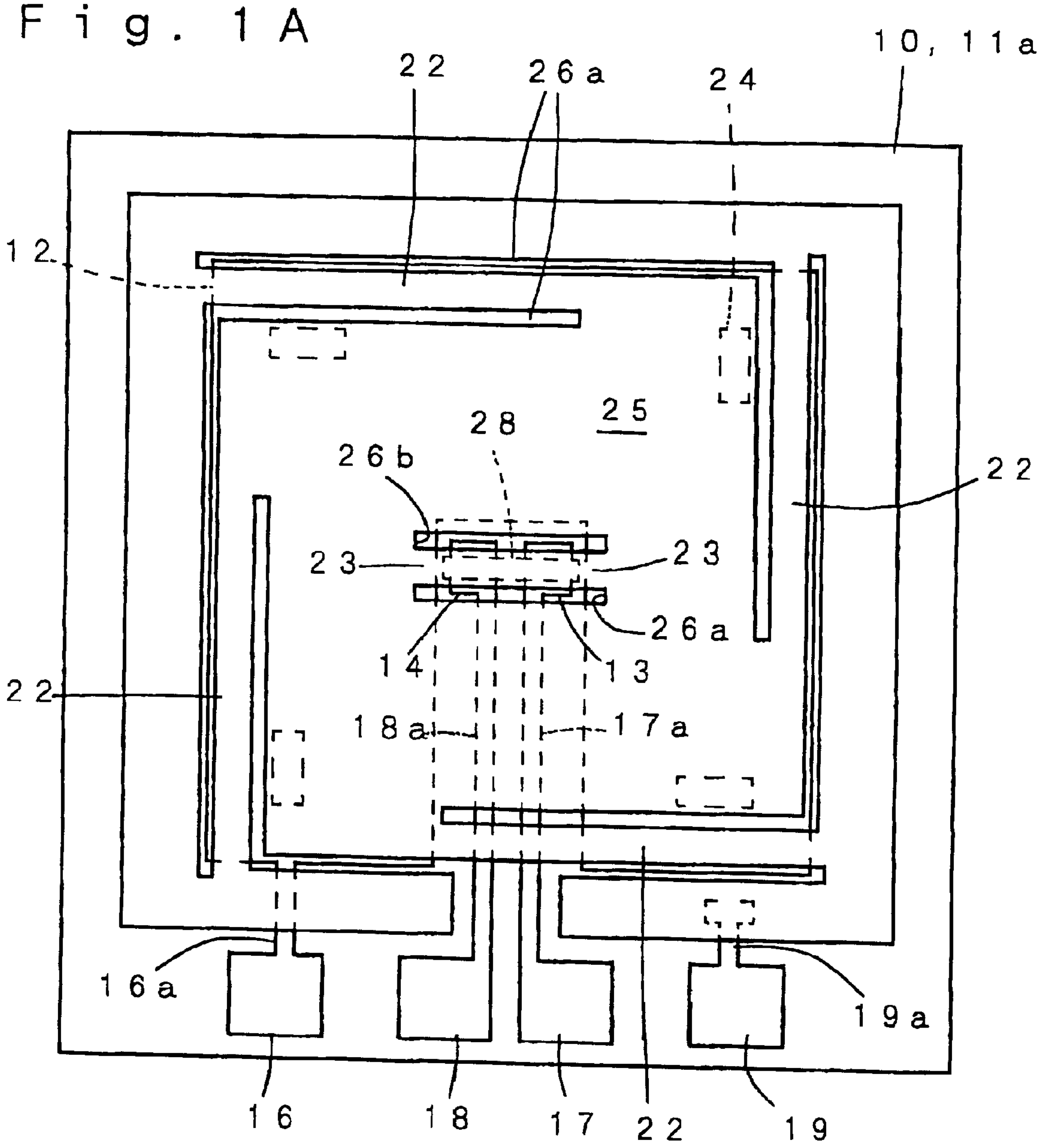
FIG. 1A is a plane view of an electrostatic microrelay according to an embodiment of the present invention.
Figure 1B:
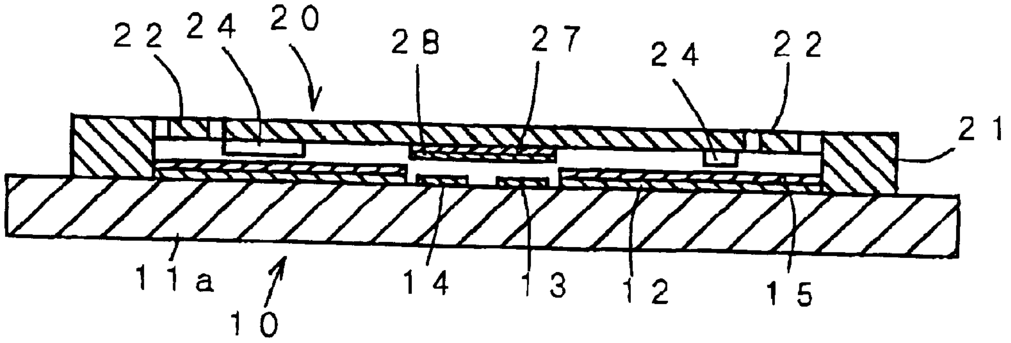
FIG. 1B is a sectional view of FIG. 1A.
Figure 2:
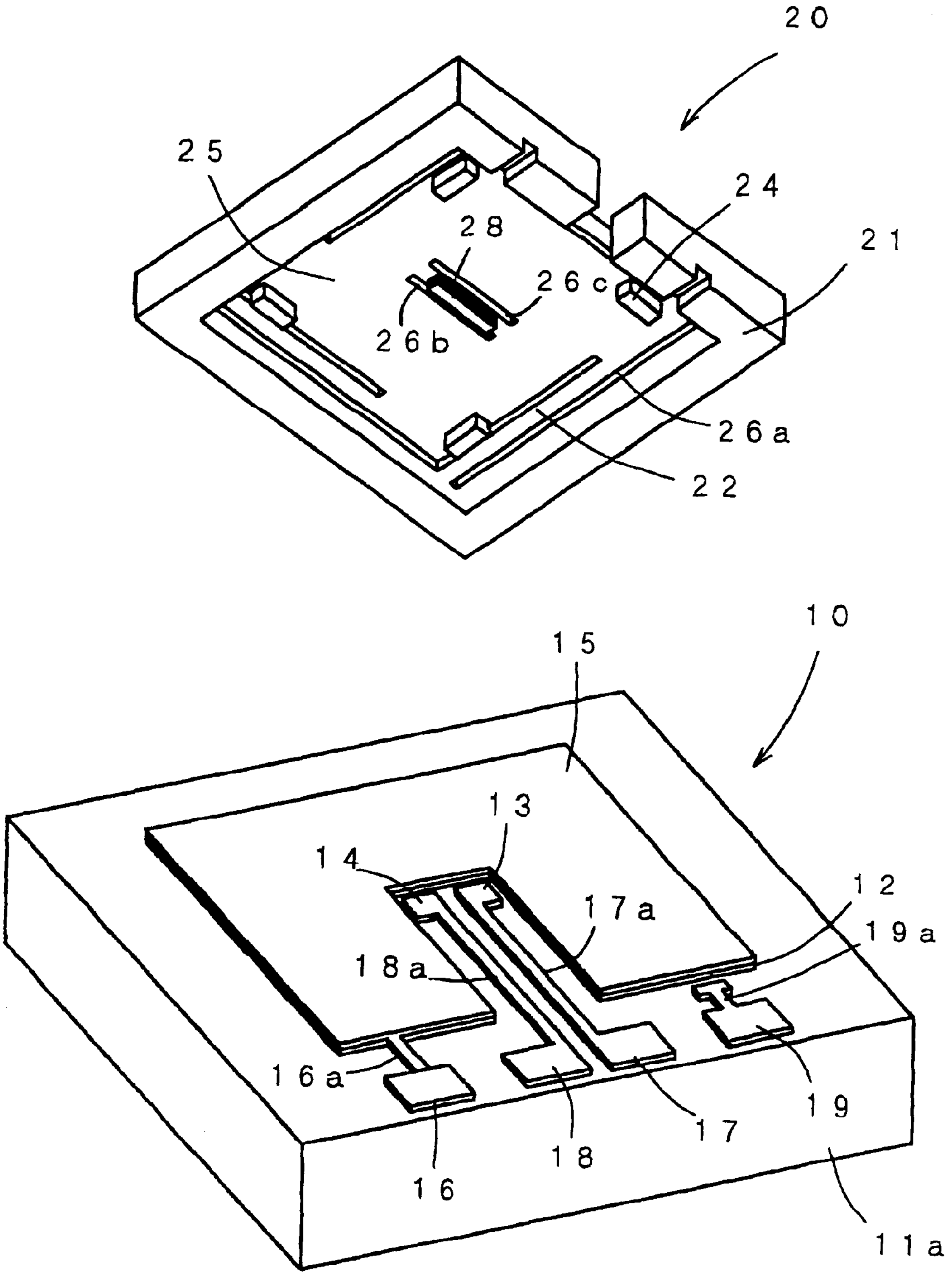
FIG. 2 is a disassembled perspective view of the electrostatic microrelay of FIG. 1.

FIGS. 1A, 1B, and FIG. 2 show an electrostatic microrelay according to an embodiment of the present invention. The electrostatic microrelay includes a fixed substrate 10 made of a glass substrate 11*a,* and a moveable substrate 20 provided on a top surface of the fixed substrate 10.

The fixed substrate 10 includes a fixed electrode 12 and fixed terminals 13, 14 both formed on the top surface of the glass substrate 11*a*. The outer surface of the fixed electrode 12 is coated with an insulating film 15. The fixed electrode 12 and the fixed terminals 13, 14 are connected to connecting pads 16 and 17, 18 via printed connection paths 16*a* and 17*a*, 18*a* respectively.

The moveable substrate 20 includes a moveable electrode 25 evenly supported by four first beam members 22, each extending sideward from top-surface ends of support members 21 which are provided at the top surface of the fixed substrate 10. Protrusions 24 are formed at the bottom surface of the moveable substrate 20 where the first beam member 22 and a moveable electrode 25 are connected each other. When the moveable substrate 20 is pulled toward the fixed substrate 10 due to electrostatic attraction force, the protrusions 24 contact the fixed substrate 10 before the terminals 13, 14, 28 are closed. Also, the protrusions 24 are formed such that when the protrusions 24 contact the fixed substrate 10 the distance between the fixed electrode 12 and the moveable electrode 25 becomes less than one third of the distance between the fixed substrate 10 electrode 12 and the moveable substrate 20 electrode 25. In this configuration, because electrostatic attraction force becomes dramatically increased at the time when the protrusions 24 contact the fixed substrate 10, it becomes possible to reliably have the moveable electrode 25 contacted with the fixed substrate 10 electrode 12 regardless of the existence of the protrusions 24.

In addition, although the protrusions 24 are formed on the moveable substrate 20, they may be formed on the fixed substrate 10 or on both substrates 10, 20. Also, the protrusions 24 may be formed at more than two positions between the terminals 13, 14, 28 and the support member 21.

The support member 21 is connected to a connecting pad 19 via a printed connection path 19*a* which is provided on the top surface of the fixed substrate 10. At the center of the moveable electrode 25, a second beam member 23 is formed by a pair of slits 26*b*, 26*c*. At the center of the bottom surface of the second beam member 23, a moveable terminal 28 is formed by using an insulation film 27. The moveable terminal 28 faces the fixed terminals 13, 14 in a manner such that they can be separated or closed.

Next, the process for producing an electrostatic microrelay having the above configuration is explained.

Figure 3A:
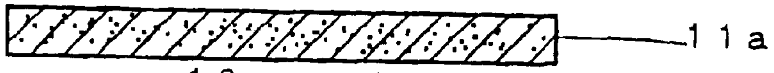
FIGS. 3A–3I are sectional views showing manufacturing process of the electrostatic microrelay shown in FIG. 1.
Figure 3B:
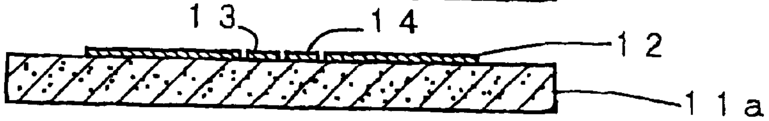
Figure 3C:
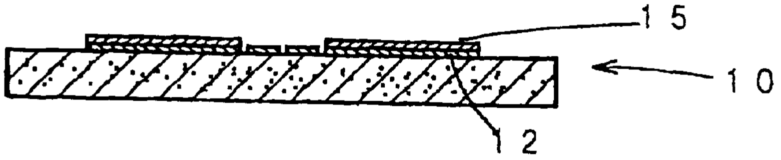

First, as shown in FIG. 3B, the fixed electrode 12 and the fixed terminals 13, 14 are formed on the glass substrate 11*a* made of a material, such as Pyrex, which is shown in FIG. 3A. Also, printed connection paths 16*a*, 17*a*, 18*a*, and 19*a* and the connecting pads 16, 17, 18 and 19 are formed thereon respectively. Thereafter, by coating the fixed electrode 12 with an insulating film 15, production of the fixed substrate 10 is completed as shown in FIG. 3C.

In addition, by using a silicon oxide having a relative dielectric constant of 3–6 or a silicon nitride having a relative dielectric constant of 7–8 for the insulating film 15, a large electrostatic attraction force can be obtained, and therefore the contact force can be increased.

Figure 3D:
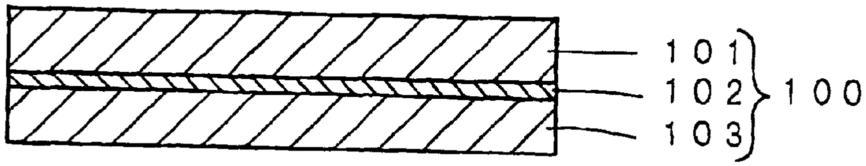
Figure 3E:
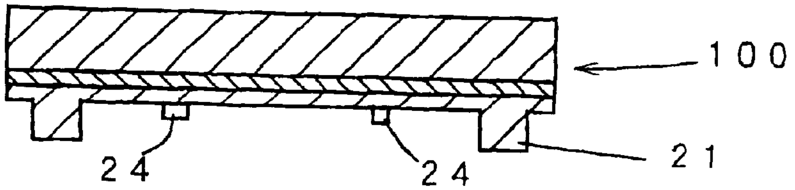
Figure 3F:
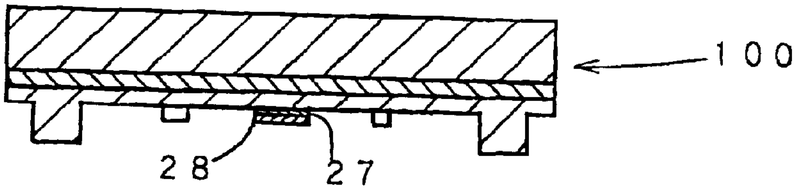

On the other hand, as shown in FIG. 3D, in order to form a terminal gap at the bottom surface of an silicon on insulator (SOI) wafer 100, which consists of a silicon layer 101, a silicon oxide layer 102 and a silicon layer 103 in this order from the top, wet etching processing is performed by tetramethylammonium hydroxide (TMAH) having silicon oxide film as a mask, forming a support member 21 and a protrusion 24 both protruding downward as shown in FIG. 3E. Then, as shown in FIG. 3F, the moveable terminal 28 is formed after coating with an insulating film 27.

Figure 3G:
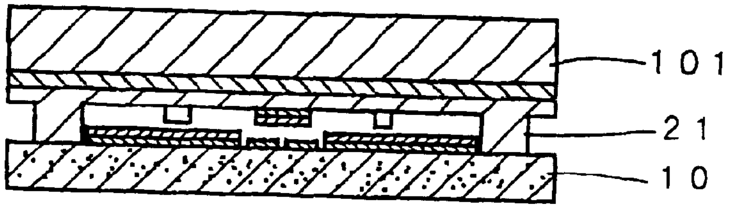
Figure 3H:
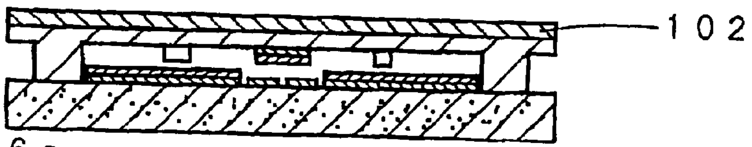
Figure 3I:
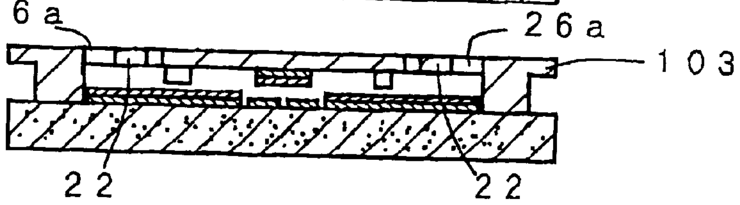

Next, as shown in FIG. 3G, the SOI wafer 100 is integrally attached to the fixed substrate 10 by anodic bonding. Then, as shown in FIG. 3H, the SOI wafer 100 is thinned by etching the top surface thereof by using alkali etchant such as TMAH or potassium hydroxide (KOH) so that the silicon oxide layer 102 is exposed. Further, the silicon oxide layer 102 is removed by using fluoric etchant, exposing the silicon layer 103, which becomes the moveable electrode 25, as shown in FIG. 3I. Thereafter, pattern-drawing etching is conducted by a dry etching processing using reactive ion etching (RIE) or the like to form a cutout 26*a* and slits 26*b*, 26*c*, thereby forming the first and second beam members (22, 23) thereon. By this processing, production of the moveable substrate 20 is completed.

The fixed substrate 10 can be produced not only from the glass substrate 1*a* but also from a single crystal silicon substrate having at least an insulating film coated thereon.

Next, performance of the electrostatic microrelay having the above configuration is explained with reference to a schematic drawing of FIG. 4.

Figure 4A:
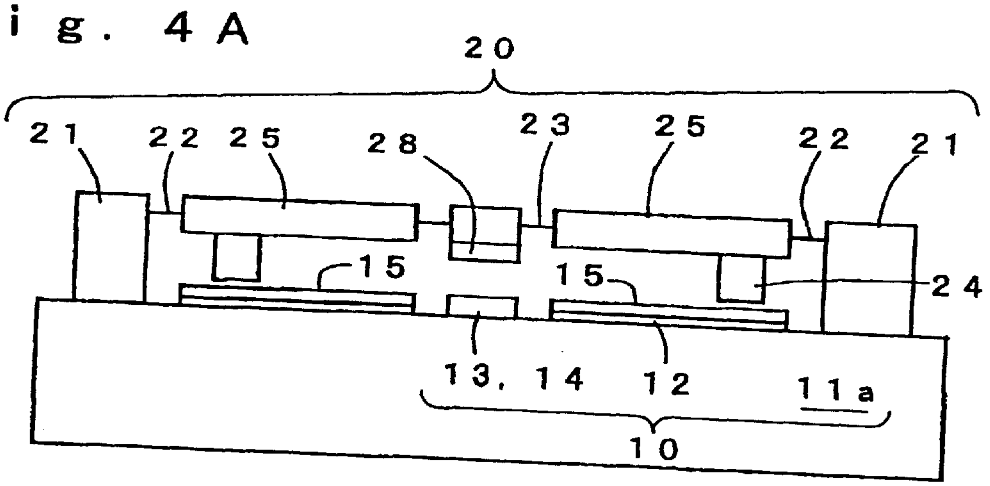
FIG. 4A–FIG. 4D are schematic views showing performing state of the electrostatic microrelay of FIG. 1.

When no voltage is applied between the electrodes as shown in FIG. 4A, the first beam members 22 are not elastically deformed and maintain the state where the first beam members 22 are horizontally extending. In this state, the moveable substrate 20 faces the fixed substrate 10 at a predetermined distance. Therefore, the moveable terminal 28 is separated from the fixed terminals 13, 14.

Figure 4B:
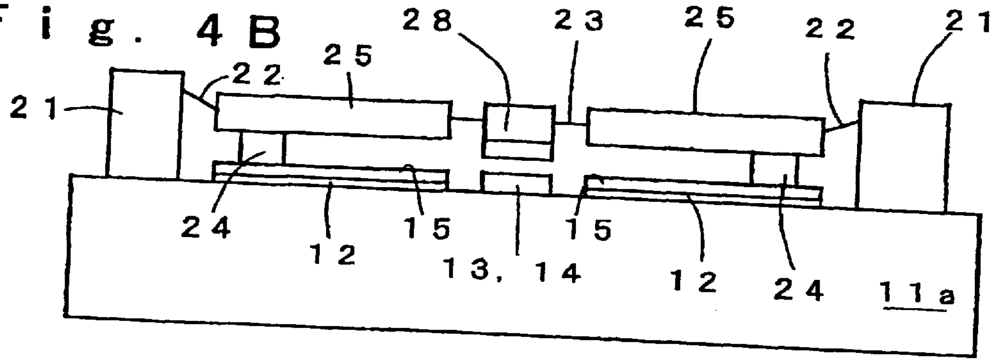
Figure 4C:
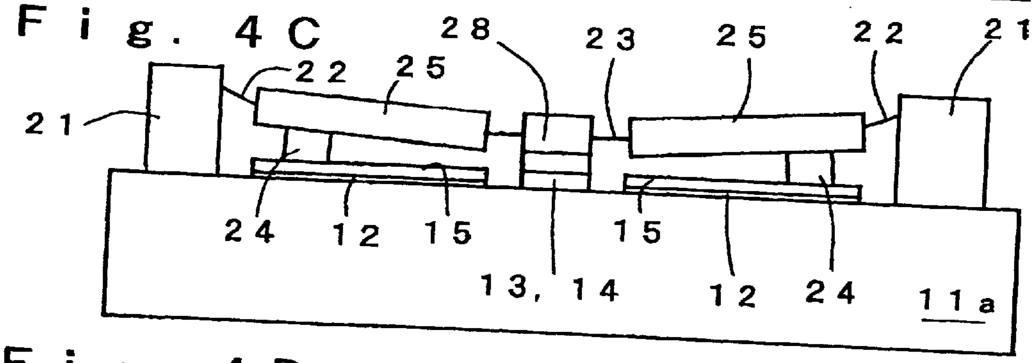
Figure 4D:
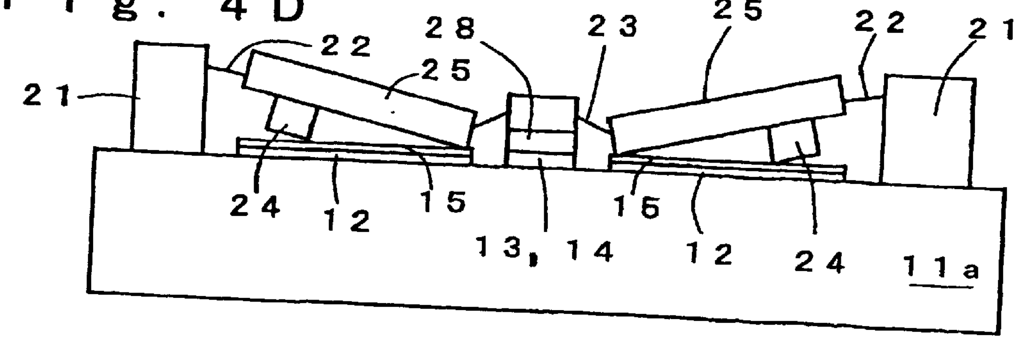
Figure 5:
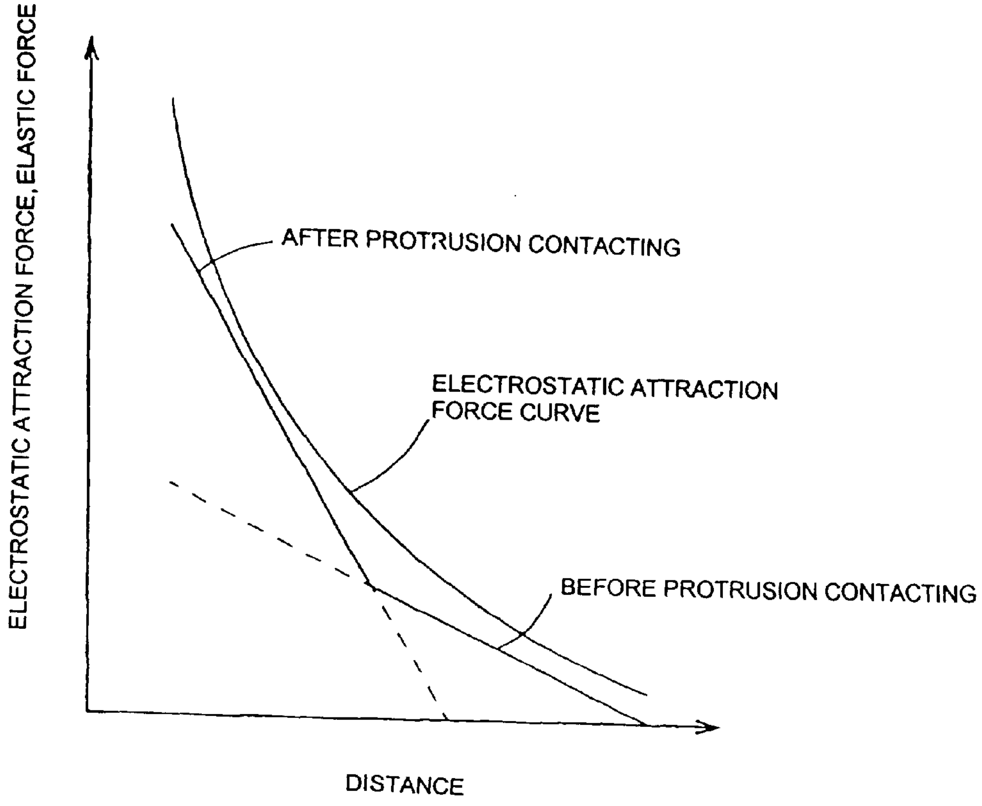
FIG. 5 is a graph showing the relationship between a distance of the electrodes and electrostatic attraction force.

In this condition, if a voltage is applied between the electrodes to generate a electrostatic attraction force therebetween, the first beam members 22 are elastically deformed such that the moveable substrate 20 comes closer to the fixed substrate 10. As a result, as shown in FIG. 4B, the protrusions 24 contact the fixed substrate 10 on contact with the insulating film 15. As shown in FIG. 5, the electrostatic attraction force increases as the distance between the electrodes becomes small. After the protrusions 24 eventually contact the fixed substrate 10, the electrostatic attraction force between the fixed electrode 12 and the moveable electrode 25 dramatically increases. Therefore, the surrounding portions of the protrusions 24 are partially elastically deformed and the moveable electrode 25 becomes adhered to the fixed electrode 12. Consequently, as shown in FIG. 4C, the moveable terminal 28 contacts the fixed terminals 13, 14 to close the relay. After the moveable terminal 28 has contacted the fixed terminals 13,14, the second beam members 23 become bent in addition to the first beam members 22 in a manner as shown in FIG. 4D, and the moveable electrode 25 is attracted to the fixed electrode 12. As the surrounding moveable electrode 25 is adhered to the fixed electrode 12, the moveable terminal 28 is pressed to the fixed terminals 13, 14 via the second beam members 23. Therefore, occurrence of one-side hitting is prevented and the contact reliability is improved.

In this case, if the force to pull the moveable electrode 25 upward caused by the first beam members 22 and second beam members 23 are respectively expressed as $F_{s1}$ and $F_{s2}$, the force to pull the moveable electrode 25 upward caused by the elastic deformation of the surrounding portion of the protrusion 24 which occurs when the protrusion 24 contacts the fixed substrate 10 to close the terminal is expressed as $F_{s3}$, the electrostatic attraction force generated between the moveable electrode 25 and the fixed electrode 12 being interposed by the insulating film 15 is expressed as $F_e$, and the resisting force derived from the surface of the insulating film 15 is expressed as $F_n$, the following relationship exists:

$$F_e=F_{s1}+F_{s2}+F_{s3}+F_n$$

By adjusting the spring constant, the initial gap between the moveable electrode 25, the fixed electrode 12, and the thickness of the terminals, the values of $F_n$ and $F_{s1}$ can be made small and, therefore, decrease of the value of $F_{s2}$, namely decrease of the contacting force (from the idealistic model), can be prevented.

Thereafter, by removing the voltage applied between the electrodes, not only the elastic force of the first and second beam members 22 and 23 but also the elastic force caused by the deformation of the surrounding portion of the protrusions 24 works as the force to separate the terminals 13, 14, 28. For this reason, the terminals can be reliably separated even if the terminals are adhered or cohered to each other. After the terminals are separated, the moveable substrate 20 is restored to its original position by the elastic force of the first beam members 22 after the terminals are separated and until the protrusions 24 are separated from the fixed substrate 10.

As explained above, in the above embodiment, due to the formation of the protrusions 24, it becomes possible to largely increase the force to break the terminals and have the moveable substrate 20 move smoothly when the applied voltage is removed.

Also, because the whole body of the moveable substrate 20 is made of a silicon wafer alone and is point-symmetrically formed between left and right, and line-symmetrically formed in cross section, deflection and/or torsion of the moveable electrode is prevented. As a result, inoperability and uncertainty of operation performance characteristics can be effectively avoided, and smooth operation characteristics can be ensured.

Figure 6A:
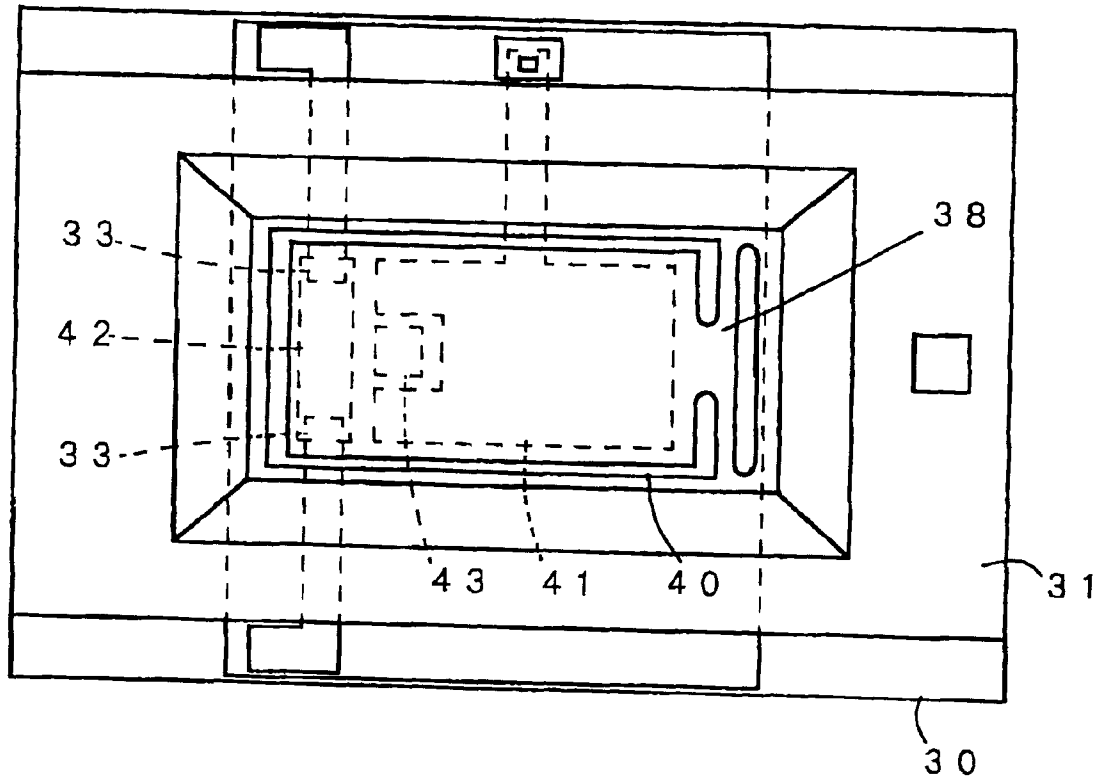
FIG. 6A is a plane view of an electrostatic microrelay according to another embodiment of the present invention.
Figure 6B:
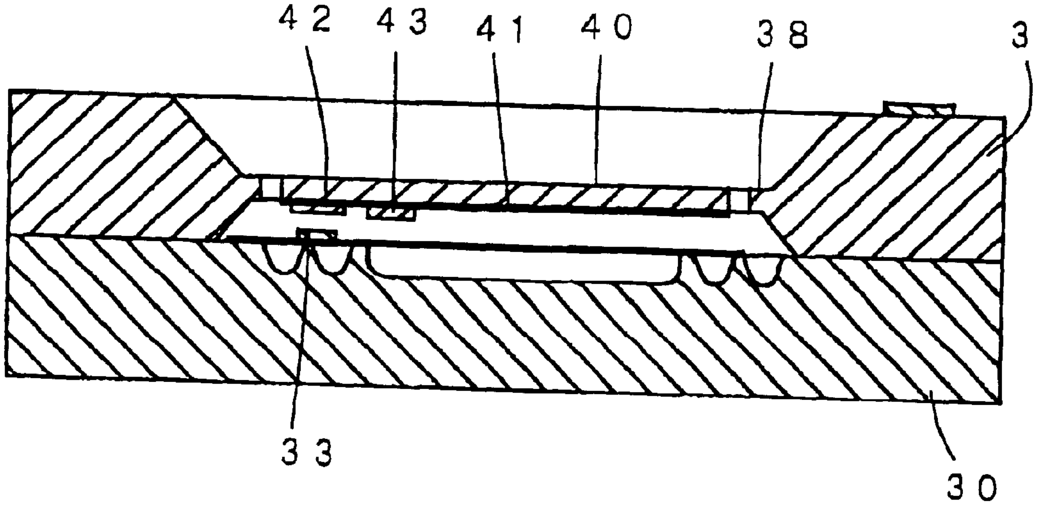
FIG. 6B is a sectional view of the electrostatic microrelay of FIG. 6A.
Figure 9:
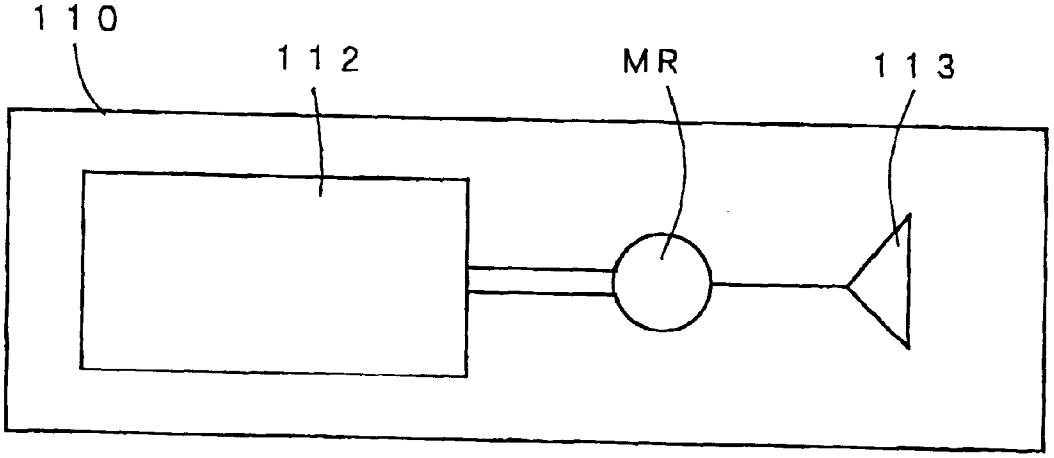
FIG. 9 is a block diagram showing the state of using the electrostatic microrelay of FIG. 1 in a wireless device.

Also, the configuration of the electrostatic microrelay may be as shown in FIGS. 6A and 6B that is similar to the conventional configuration which is shown in FIG. 9.

Namely, this electrostatic microrelay is formed of a rectangular frame body wherein a support member 31 is provided on the top surface of a fixed substrate 30. A moveable substrate 40 is cantilevered by a connecting member 38 at an interior edge of the support member 31. An insulation film 41 is provided on the bottom surface of the moveable substrate 40 and a moveable terminal 42 is formed on the free side end thereof. Also, a protrusion 43 is formed between the moveable terminal 42 and the connecting member 38. The protrusion 43 contacts the fixed substrate 30 before the moveable terminal 42 contacts the fixed terminal 33.

In addition, according to the above embodiment, although the moveable electrode 25 provided on the moveable substrate 40 is formed in a flat shape, it may be formed in a thin shape having a concavity formed on top surface thereof. In this configuration, the operation speed and recovery speed can be further improved while maintaining desired strength and light weight.

The moveable electrode 25 provided on the moveable substrate 40 may be made larger in thickness than the connecting member 38 so that the strength of the electrode becomes larger. Under this configuration, the electrostatic attraction force can be fully transformed into the attraction force for the moveable electrode 25, so that the electrostatic attraction force can be efficiently used to deform.

Figure 7:
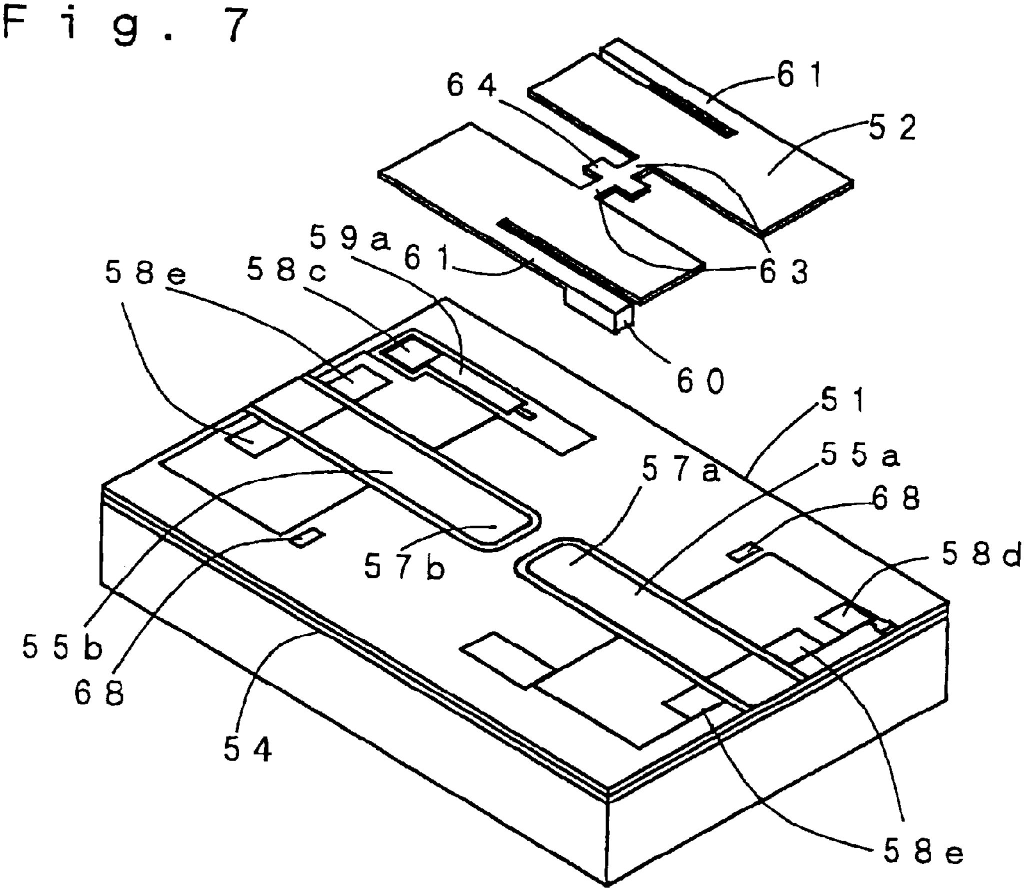
FIG. 7 is a disassembled perspective view of the electrostatic microrelay according to another embodiment of the present invention.

The embodiment may be formed as shown in FIG. 7.

Signal lines 55*a* and 55*b* are positioned on a same straight line. Terminals 57*a* and 57*b* are provided next to each other at a predetermined distance in the central area of the fixed substrate 51. A fixed electrode 54 is provided with a connection pad 58*d* for applying a voltage and a connection pad 58*e* for grounding. The connection pad 58*e* works to prevent leakage of signal when a high frequency signal is transmitted by using the signal lines 55*a*, 55*b*.

Figure 8:
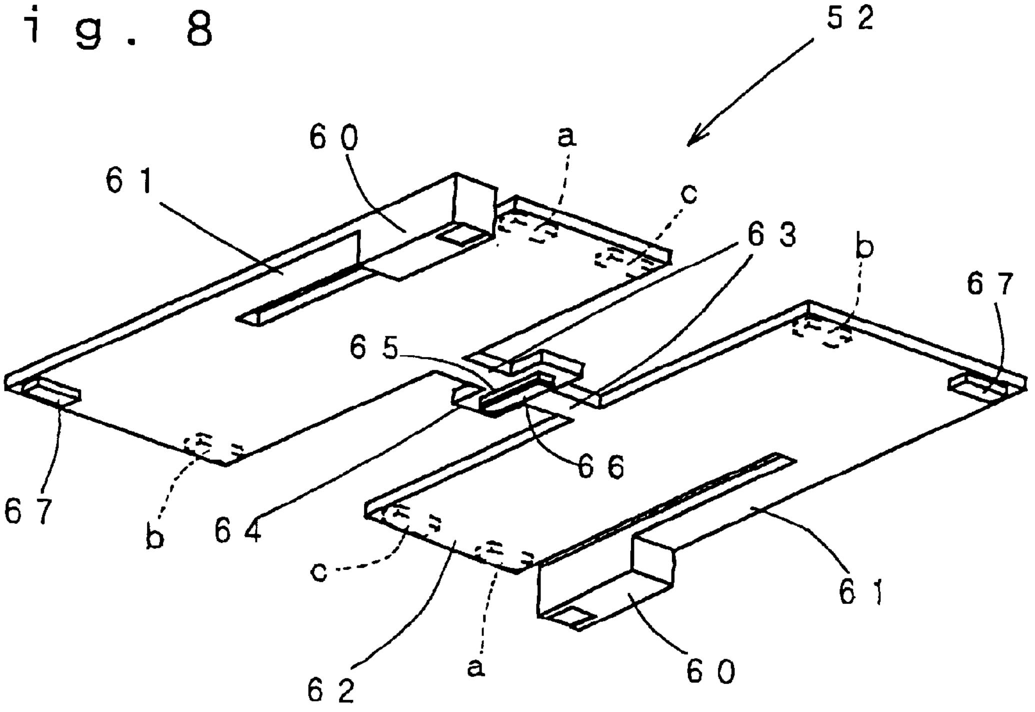
FIG. 8 is a perspective view showing the state of the moveable substrate of FIG. 7 from another angle.

The moveable substrate 52 shown in FIG. 8 has a configuration that the moveable electrode 62 is evenly supported by the two first beam members 61 which extends sideward from the support member 60 standing on the top surface of the fixed substrate 51. In the center of the moveable electrode 62, there is provided a terminal block 64 which is supported by a pair of the second beam members 63. The portion which faces the signal lines is removed. At the bottom surface of the moveable electrode 62, there are provided the protrusions 67 formed at the point-symmetrical position about the moveable terminal 66. More specifically, the protrusions 67 are formed at the positions where the moveable electrode 62 first contacts the fixed electrode 54. According to this configuration, when the moveable substrate 52 is pulled downward due to the electrostatic attraction force, the protrusions 67 contact the fixed substrate 51 before the terminals are closed. Under this condition, the increase of the breaking force and decrease of the contacting force caused by the increase becomes idealistic rate condition.

The protrusions 67 are closer to the opposing fixed substrate 54 than the other portion (of the moveable electrode 62). Thus, the electrostatic attraction force becomes large so that the electric field becomes concentrated. If foreign matter, such as an organic material, exists around the protrusion, such foreign matter is attracted to the protrusions 67 where the electric field is concentrated and is eventually adhered to the protrusions 67. In this case, it is possible that the height of the protrusion 67 is changed and the operation characteristics become unstable. Therefore, as shown in FIG. 7, there is provided non-electric portions 68 which do not have the fixed electrode 54 in the position facing the protrusions 67. However, if the protrusions 67 are made of insulating material, such as an oxide film, the generation of the electrostatic force can be decreased. In this case, the non-electric portion 68 is not necessary. Also, if the protrusions 67 are formed, for example, in a half pillar shape, concentration of the electric field can be decreased and therefore foreign matter is not attracted. As shown in FIG. 4D, for example, during wet etching by TMAH with silicon oxide used as a mask, the protrusions 67 may be formed together with the support potions 60. The protrusions 67 may be formed on the fixed substrate 1 or on both substrates. Further, more than two pairs of the protrusions 67 may be formed between the terminals and the support member 60. In this case, protrusions 67 can be formed at the position where the fixed substrate 51 next contacts the moveable substrate 52 after the protrusion 67 first contacted the fixed substrate 51. This is shown in FIG. 7, in order of a, b and c shown by the dotted line. Under this configuration, it becomes possible to stabilize the contacting force and breaking force.

Although, in the above embodiment, the moveable substrate 52 is supported by four or two first beam members 22 or 61, the moveable substrate 52 may be supported by three, five, or more beam members. Under this configuration, the area efficiency of the electrostatic microrelay can be enhanced.

Figure 10:
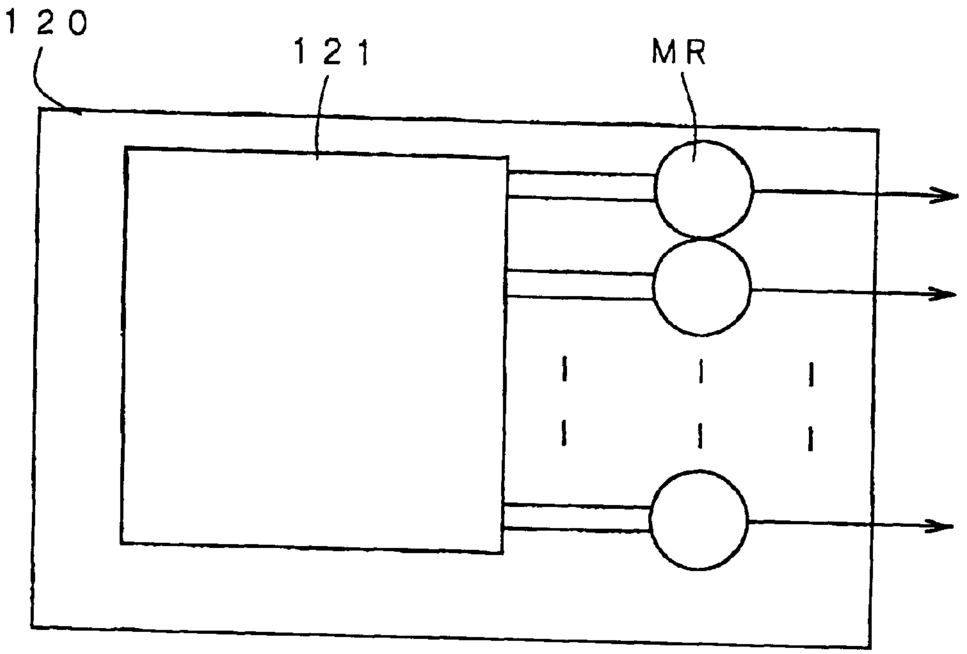
FIG. 10 is a block diagram showing the state of using the electrostatic microrelay of FIG. 1 in a measuring device.
Figure 11A:
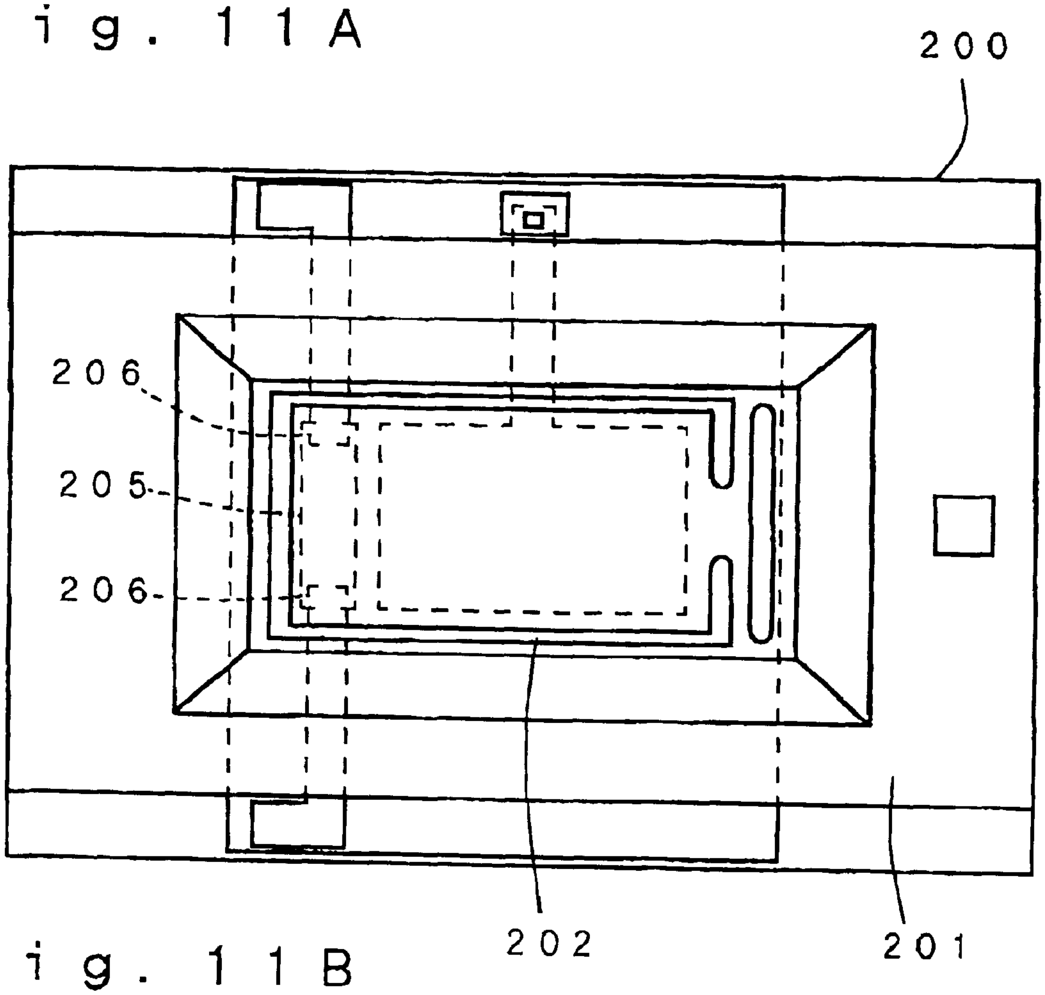
FIG. 11A and FIG. 11B are partial front views of an electrostatic microrelay of the prior art.
Figure 11B:
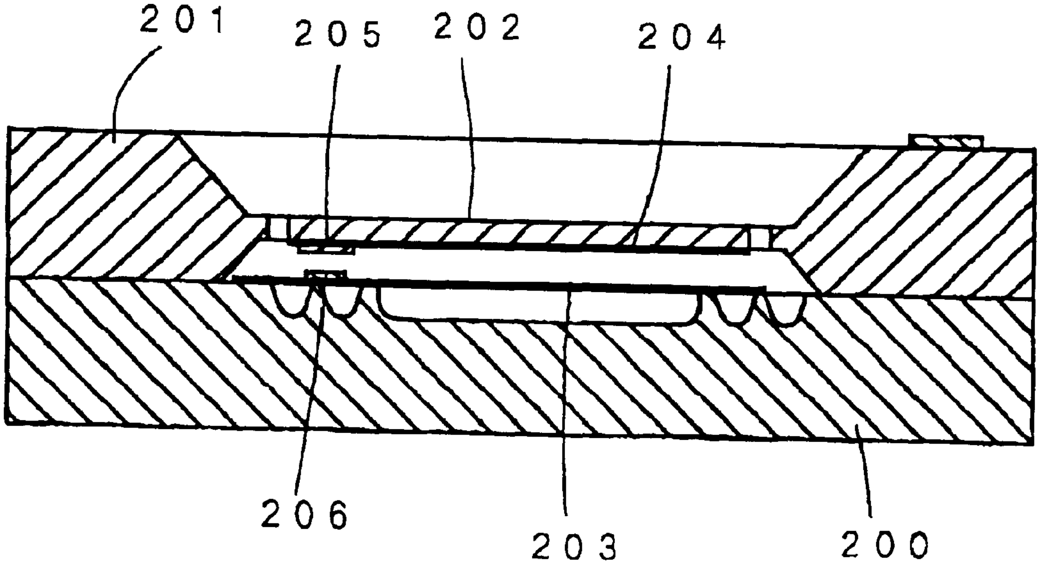

Because the above described electrostatic microrelay MR has the characteristic of effectively transmitting direct-current and high frequency signals in a good condition with low loss, it can be used in a radio device 110 shown in FIG. 9 or a measuring device 120 shown in FIG. 10. In FIG. 9, the electrostatic microrelay MR is connected between an internal circuit 112 and an antenna 113. In FIG. 10, the electrostatic microrelay MR is connected in the middle of each signal line from an internal circuit 121 to a measurement subject (not shown). By using the microrelay of the present invention, signals can be transmitted with high accuracy and less burden to an amplifier used in the internal circuit as compared to a prior art microrelay. Also, because the microrelay of the present invention is small in size and consumes less electricity, it can fulfill its performance especially in a battery driven wireless device or measuring device.

What is claimed is:

1. An electrostatic microrelay comprising:

a fixed substrate having a fixed electrode and a fixed terminal on an upper surface thereof;

a moveable substrate having a moveable electrode and a moveable terminal on a lower surface thereof, the moveable substrate elastically supported by a support member disposed between the fixed substrate and the moveable substrate in a manner that the lower surface of the moveable substrate faces the upper surface of the fixed substrate at a predetermined distance; and a protrusion provided on at least one of the upper surface of the fixed substrate and the lower surface of the moveable substrate in the area the moveable electrode is attracted when applying voltage between the moveable electrode and the fixed electrode, the protrusion having a predetermined height;

wherein, upon applying voltage between the moveable electrode and the fixed electrode, the moveable electrode is attracted to the fixed electrode such that the protrusion provided on one of the upper surface of the fixed substrate and the lower surface of the moveable substrate contacts the other substrate and the moveable terminal elastically contacts the fixed terminal to close the microrelay in this order, and, upon releasing the voltage from the electrode, the moveable terminal becomes reliably separated from the fixed terminal by a repulsive elastic force caused by the contact between the protrusion and the other substrate.

2. The electrostatic microrelay according to claim 1, wherein the protrusion is disposed on a lower surface of the moveable substrate.

3. The electrostatic microrelay according to claim 1, wherein the protrusion is disposed on a upper surface of the fixed substrate.

4. The electrostatic microrelay according to claim 2, wherein the protrusion is disposed at least at one position between the support member and the moveable terminal.

5. The electrostatic microrelay according to claim 3, wherein the protrusion is disposed at least at one position between the support member and the fixed terminal.

6. The electrostatic microrelay according to claim 1, wherein the height of the protrusion is adapted such that when the protrusion is contacted with one of the moveable substrate and the fixed substrate, a distance between the moveable electrode and the fixed electrode becomes less than one third of a distance between the moveable substrate electrode and the fixed substrate electrode before applying voltage.

7. The electrostatic microrelay according to claim 1, wherein the moveable substrate is supported by a plurality of beam members that are extended from the support member such that the moveable substrate and the fixed substrate are disposed at a predetermined distance.

8. The electrostatic microrelay according to claim 7, wherein a plurality of protrusions are disposed at an equal distance from one of the beam members.

9. The electrostatic microrelay according to claim 1, wherein the moveable terminal is disposed at a center of the moveable electrode, the moveable substrate is elastically supported by two beam members at two point-symmetrical positions about the moveable terminal, the two beam member are extended from two support members, each support member provided on a opposite side end of the lower surface of the moveable substrate, and a pair of protrusions are disposed on a lower surface of the moveable electrode at two point-symmetrical positions about the moveable terminal.

10. The electrostatic microrelay according to claim 1, wherein a plurality of protrusions are disposed at positions between the moveable substrate and the fixed substrate where the moveable electrode first contacts the fixed electrode upon applying a voltage therebetween such that the protrusions disposed at that positions contact the other substrate before the moveable terminal contacts the fixed terminal.

11. The electrostatic microrelay according to claim 1, wherein the protrusion comprises an insulating material.

12. The electrostatic microrelay according to claim 1, wherein an electrode is not disposed at a position where the protrusion contacts one of the fixed substrate and the moveable substrate.

13. A wireless device comprising a microrelay, the microrelay comprising:

a fixed substrate having a fixed electrode and a fixed terminal on a upper surface thereof;

a moveable substrate having a moveable electrode and a moveable terminal on a upper surface thereof, the moveable substrate elastically supported by a support member disposed between the fixed substrate and the moveable substrate in a manner that the lower surface of the moveable substrate faces the upper surface of the fixed substrate at a predetermined distance; and a protrusion provided on at least one of the lower surface of the fixed substrate and the upper surface of the moveable substrate in the area the moveable electrode is attracted when applying voltage between the moveable electrode and the fixed electrode, the protrusion having a predetermined height;

wherein, upon applying voltage between the moveable electrode and the fixed electrode, the moveable electrode is attracted to the fixed electrode such that the protrusion provided on one of the upper surface of the fixed substrate and the lower surface of the moveable substrate contacts the other substrate and the moveable terminal elastically contacts the fixed terminal to close the microrelay in this order, and, upon releasing the voltage from the electrode, the moveable terminal becomes reliably separated from the fixed terminal by a repulsive elastic force caused by the contact between the protrusion and the other substrate, the microrelay interconnected between an antenna and an internal circuit.

14. A measuring device comprising an electrostatic microrelay, the microrelay comprising:

a fixed substrate having a fixed electrode and a fixed terminal on a upper surface thereof;

a moveable substrate having a moveable electrode and a moveable terminal on a upper surface thereof, the moveable substrate elastically supported by a support member disposed between the fixed substrate and the moveable substrate in a manner that the lower surface of the moveable substrate faces the upper surface of the fixed substrate at a predetermined distance; and a protrusion provided on at least one of the lower surface of the fixed substrate and the upper surface of the moveable substrate in the area the moveable electrode is attracted when applying voltage between the moveable electrode and the fixed electrode, the protrusion having a predetermined height;

wherein, upon applying voltage between the moveable electrode and the fixed electrode, the moveable electrode is attracted to the fixed electrode such that the protrusion provided on one of the upper surface of the fixed substrate and the lower surface of the moveable substrate contacts the other substrate and the moveable terminal elastically contacts the fixed terminal to close the microrelay in this order, and, upon releasing the voltage from the electrode, the moveable terminal becomes reliably separated from the fixed terminal by a repulsive elastic force caused by the contact between the protrusion and the other substrate, the microrelay interconnected between a measurement object and an internal circuit.

* * * * *

UNITED STATES PATENT AND TRADEMARK OFFICE

CERTIFICATE OF CORRECTION

PATENT NO. : 6,486,425 B2 
DATED : November 26, 2002
INVENTOR(S) : Tomonori Seki It is certified that error appears in the above-identified patent and that said Letters Patent is hereby corrected as shown below:

Title page,
Item [57], ABSTRACT,
Line 8, please add -- such -- after “manner”

Column 3,
Line 4, please add -- the -- before “electrode”
Lines 66 and 67, please replace “at” with -- on --

Column 6,
Line 16, please add -- single -- after “a” and remove “alone”

Column 7,
Line 45, remove the comma after “Although”

Column 8,
Line 59, please replace “a” with -- the --

Signed and Sealed this

Fifteenth Day of July, 2003

JAMES E. ROGAN
*Director of the United States Patent and Trademark Office*